(12) United States Patent
Kitatani et al.

(10) Patent No.: US 10,574,033 B2
(45) Date of Patent: Feb. 25, 2020

(54) ARRAYED SEMICONDUCTOR DEVICE, OPTICAL TRANSMISSION MODULE, OPTICAL MODULE, AND METHOD FOR MANUFACTURING THEREOF

(71) Applicant: Lumentum Japan, Inc., Sagamihara, Kanagawa (JP)

(72) Inventors: Takeshi Kitatani, Tokyo (JP); Koichiro Adachi, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 16/520,764

(22) Filed: Jul. 24, 2019

(65) Prior Publication Data

US 2019/0348818 A1 Nov. 14, 2019

Related U.S. Application Data

(63) Continuation of application No. 15/696,604, filed on Sep. 6, 2017.

(30) Foreign Application Priority Data

Nov. 30, 2016 (JP) .................................. 2016-233431

(51) Int. Cl.
*H01S 5/40* (2006.01)
*H01S 5/12* (2006.01)
(Continued)

(52) U.S. Cl.
CPC ............ *H01S 5/4087* (2013.01); *H01S 5/026* (2013.01); *H01S 5/1231* (2013.01);
(Continued)

(58) Field of Classification Search
CPC ...................................................... H01S 5/1231
See application file for complete search history.

(56) References Cited

U.S. PATENT DOCUMENTS 5,561,682 A * 10/1996 Aoki ...................... B82Y 20/00
372/26
5,953,359 A * 9/1999 Yamaguchi ........... H01S 5/0265
372/23
(Continued)

FOREIGN PATENT DOCUMENTS

JP 07-226563 A 8/1995

*Primary Examiner* — Xinning (Tom) Niu
*Assistant Examiner* — Sean P Hagan
(74) *Attorney, Agent, or Firm* — Harrity & Harrity, LLP

(57) ABSTRACT

In the arrayed semiconductor optical device, a plurality of semiconductor optical devices including a first semiconductor optical device and a second semiconductor optical device are monolithically integrated on a semiconductor substrate, each of the semiconductor optical devices includes a first semiconductor layer having a multiple quantum well layer and a grating layer disposed on an upper side of the first semiconductor layer, a layer thickness of the first semiconductor layer of the first semiconductor optical device is thinner than a layer thickness of the first semiconductor layer of the second semiconductor optical device, and a height of the grating layer of the first semiconductor optical device is lower than a height of the grating layer of the second semiconductor optical device corresponding to difference in the layer thickness of the first semiconductor layer.

6 Claims, 20 Drawing Sheets

(51) Int. Cl.
  *H01S 5/227* (2006.01)
  *H01S 5/22* (2006.01)
  *H01S 5/026* (2006.01)
  *H01S 5/022* (2006.01)

(52) U.S. Cl.
  CPC ............ *H01S 5/02284* (2013.01); *H01S 5/22* (2013.01); *H01S 5/2272* (2013.01); *H01S 2304/00* (2013.01)

(56) References Cited

U.S. PATENT DOCUMENTS

| | | |
|---|---|---|
| 6,107,112 A | 8/2000 | Kito |
| 2003/0170924 A1* | 9/2003 | Takiguchi ................. H01S 5/12 438/29 |
| 2007/0053399 A1 | 3/2007 | Johnson |
| 2008/0165818 A1 | 7/2008 | Hashimoto |
| 2014/0219304 A1 | 8/2014 | Lee |

* cited by examiner

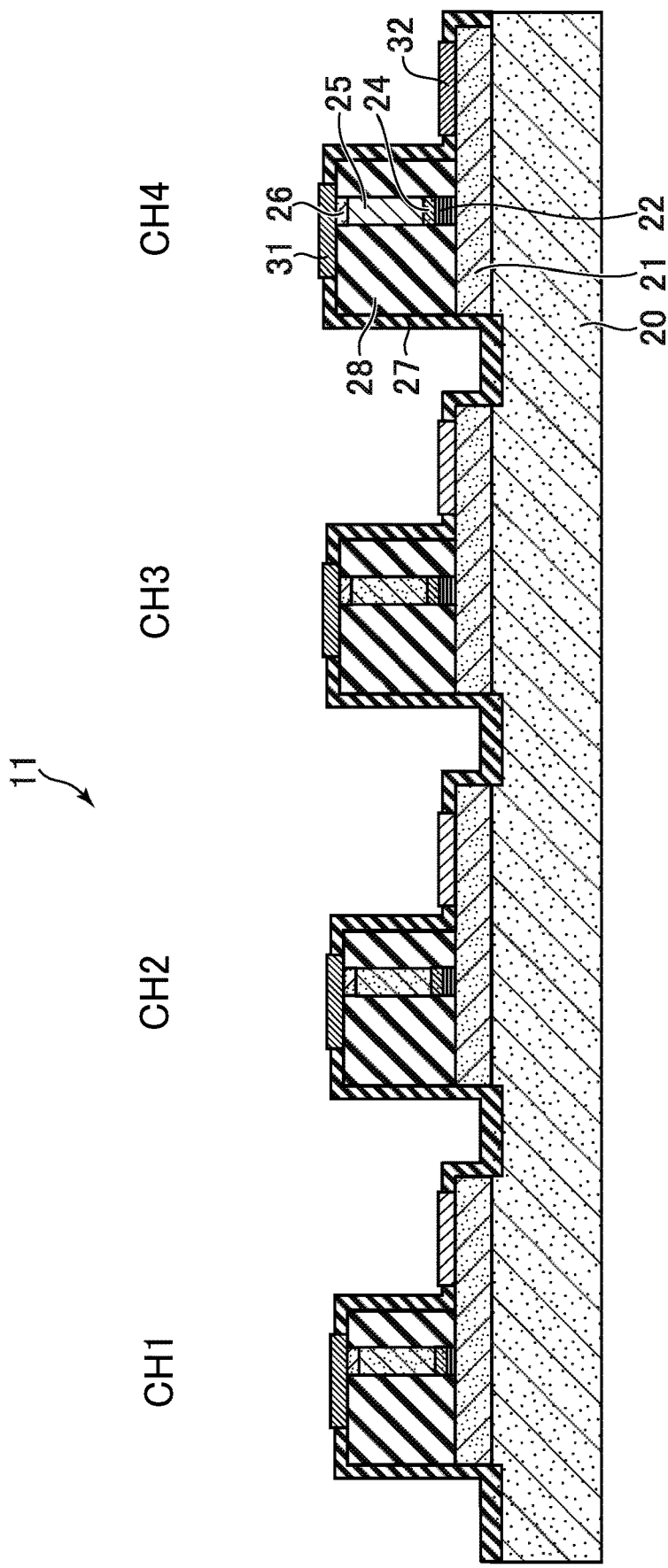

ARRAYED SEMICONDUCTOR DEVICE, OPTICAL TRANSMISSION MODULE, OPTICAL MODULE, AND METHOD FOR MANUFACTURING THEREOF

CROSS-REFERENCE TO RELATED APPLICATION

The present application is a continuation application of U.S. Ser. No. 15/696,604, filed Sep. 6, 2017 which claims priority from Japanese application JP 2016-233431, filed on Nov. 30, 2016, the content of which is hereby incorporated by reference into this application.

BACKGROUND OF THE INVENTION

1. Field of the Invention

The present invention relates to an arrayed semiconductor optical device, an optical transmitter module, an optical module, and a method for manufacturing thereof, specifically, to a technique for reducing variation in performance of devices between channels.

2. Description of the Related Art

An arrayed semiconductor optical device on which a plurality of semiconductor optical devices having mutually different emission wavelengths are mounted is generally used. It is desired to realize both large capacity and small size of the arrayed semiconductor optical device. For such purpose, technique capable of increasing the number of the plurality of semiconductor optical devices (the number of channels) which are mounted on one arrayed semiconductor optical device and mounting the plurality of semiconductor optical devices in a small area is necessary.

In a fabrication of an arrayed semiconductor optical device, an arraying method in which semiconductor optical devices having corresponding emission wavelengths are respectively fabricated by separate wafer processes and are integrated in a hybrid manner at the time of mounting is widely used. In this case, since it is necessary to mount each semiconductor optical device individually, there is a limit to high density mounting considering a space required for the mounting. Additionally, the number of wafers corresponding to the number of channels is fabricated, which is also a problem from a viewpoint of cost reduction.

On the other hand, monolithic integrated technique in which a plurality of semiconductor optical devices can be simultaneously fabricated on one wafer by a common crystal growth process has been proposed. By using this method, a plurality of arrayed semiconductor optical devices in which a plurality of semiconductor optical devices having mutually different emission wavelengths are formed with device spacing of, for example, about several hundred μm are fabricated on one wafer, and there is a possibility that a size of the arrayed semiconductor optical device itself can be reduced. As an example of the monolithic integrated technique, there is a Selective-Area-Growth (SAG) method described in JP 07-226563A.

In the monolithic integrated technique disclosed in JP H07-226563A, a pair of insulator masks having different mask width and forming a pair of stripes is formed in regions in which a plurality of semiconductor optical devices are formed using the Selective-Area-Growth effect by Metal-organic vapor phase epitaxy (MOVPE). As a result, since a layer thickness increases according to mask spacing and mask width and composition change occurs, multiple quantum well (MQW) layers having mutually different emission wavelengths can be simultaneously formed on the same wafer by a common crystal growth process. For example, as the mask width increases, the group III atoms that have reached on the mask diffuse more and an amount of those that contributes to growth in an opening between the masks increases. Thus, an increase rate of a layer thickness increases and larger change in a emission wavelength can be caused.

For example, in a case where each semiconductor optical device of an arrayed semiconductor optical device is composed of a distributed feedback (DFB) laser, an arrayed semiconductor optical device in which a plurality of semiconductor optical devices having mutually different emission wavelengths are integrated can be realized on the same substrate by changing a period of gratings on a wafer surface using one wafer having the same emission wavelength. However, differences (detuning) between emission wavelength of a semiconductor optical device and emission wavelength (gain peak) of MQW layer (active layer) in each channel vary for each semiconductor optical device in each channel, so that there is large variation in performance of each semiconductor optical device in one arrayed semiconductor optical device.

On the other hand, JP 07-226563A discloses that a plurality of semiconductor optical devices having desired emission wavelengths can be realized by one-time crystal growth process using the monolithic integrated technique. A fabrication method using a method capable of changing an emission wavelength itself of an MQW layer like the SAG method is desirable in that detuning can be kept within a predetermined range.

In a case where each semiconductor optical device is a DFB laser, grating is provided in a semiconductor multilayer structure of each semiconductor optical device for making a single mode emission. In a fabrication method of an arrayed semiconductor optical device using SAG method described in JP 07-226563A, the grating is formed in advance on the substrate side of a MQW layer (active layer), or formed on the side opposite to the substrate side of the MQW layer (active layer) by using a grating layer that selectively grows in the same process as the MQW layer. In the former (lower side grating), a crystallinity of the MQW layer may be deteriorated due to an influence of unevenness of the grating disposed on the lower side of the MQW layer. In the latter (upper side grating), the deterioration of the crystallinity seen in the former is less likely to occur. In addition, it is possible to precisely determine a forming condition of the grating after confirming an emission wavelength of an MQW layer. Therefore, an arrayed semiconductor optical device in which a plurality of semiconductor optical devices having the upper side grating are monolithically integrated is desirable.

However, when the MQW layer and the upper side grating is selectively grown in the same process, a layer thickness of the grating layer differs for each semiconductor optical device in each channel. As a result of an intensive study by inventors, variation in performance of the semiconductor optical device in each channel may occur due to the difference in the layer thickness of the grating layer.

SUMMARY OF THE INVENTION

The present invention has been made in view of such problems and an object of the present invention is to provide an arrayed semiconductor optical device realizing miniaturization of an optical transmitter module and an optical module, and a method for manufacturing thereof while reducing variation in performance of semiconductor optical devices between channels.

(1) In order to solve the above-mentioned problems, according to the present invention, there is provided an arrayed semiconductor optical device in which a plurality of semiconductor optical devices including a first semiconductor optical device and a second semiconductor optical device are monolithically integrated on a semiconductor substrate, each of the semiconductor optical devices includes a first semiconductor layer having a multiple quantum well layer and a grating layer disposed on an upper side of the first semiconductor layer, a layer thickness of the first semiconductor layer of the first semiconductor optical device is thinner than a layer thickness of the first semiconductor layer of the second semiconductor optical device, and a height of the grating layer of the first semiconductor optical device is lower than a height of the grating layer of the second semiconductor optical device corresponding to difference in the layer thickness of the first semiconductor layer.

(2) In the arrayed semiconductor optical device according to the above-mentioned (1), the first semiconductor layer of each of the semiconductor optical devices may further include a lower side optical guide layer disposed in contact with a lower side of the multiple quantum well layer and an upper side optical guide layer disposed in contact with an upper side of the multiple quantum well layer.

(3) In the arrayed semiconductor optical device according to the above-mentioned (2), the first semiconductor layer of each of the semiconductor optical devices may be composed of the lower side optical guide layer, the multiple quantum well layer, and the upper side optical guide layer.

(4) In the arrayed semiconductor optical device according to any one of the above-mentioned (1) to (3), difference in heights between the grating layer of the first semiconductor optical device and the grating layer of the second semiconductor optical device may be substantially due to difference in the layer thickness of the first semiconductor layer.

(5) In the arrayed semiconductor optical device according to any one of the above-mentioned (1) to (4), each of the semiconductor optical devices may further include an etching stop layer disposed between the first semiconductor layer and the grating layer.

(6) According to the present invention, there may be provided an optical transmitter module including the arrayed semiconductors optical device according to any one of the above-mentioned (1) to (5).

(7) According to the present invention, there may be provided an optical module including the optical transmitter module according to the above-mentioned (6).

(8) According to the present invention, there is provided a method for manufacturing an arrayed semiconductor optical device including a plurality of semiconductor optical devices including a first semiconductor optical device and a second semiconductor optical device which are monolithically integrated on a semiconductor substrate, each of the semiconductor optical devices includes a first semiconductor layer having multiple quantum well layer and a grating layer disposed on an upper side of the first semiconductor layer, the method may include a first semiconductor layer deposition process of simultaneously depositing the first semiconductor layer of the first semiconductor optical device and the first semiconductor layer of the second semiconductor optical device such that the layer thickness of the first semiconductor layer of the first semiconductor optical device is thinner than that of the first semiconductor layer of the second semiconductor optical device; and a grating layer deposition process of simultaneously depositing the grating layer of the first semiconductor optical device and that of the second semiconductor optical device under common deposition conditions.

(9) In the method for manufacturing the arrayed semiconductor optical device according to the above-mentioned (8), in the first semiconductor layer deposition process, the first semiconductor layer of the first semiconductor optical device and the first semiconductor layer of the second semiconductor optical device may simultaneously be deposited by Selective-Area-Growth.

The present invention may provide the arrayed semiconductor optical device realizing miniaturization of the optical transmitter module and the optical module, and the method for manufacturing thereof while reducing variation in performance of semiconductor optical devices between channels.

BRIEF DESCRIPTION OF THE DRAWINGS

FIG. 8 is a schematic diagram illustrating a structure of the arrayed semiconductor optical device according to the third embodiment of the invention.

DETAILED DESCRIPTION OF THE INVENTION

Figure 1:
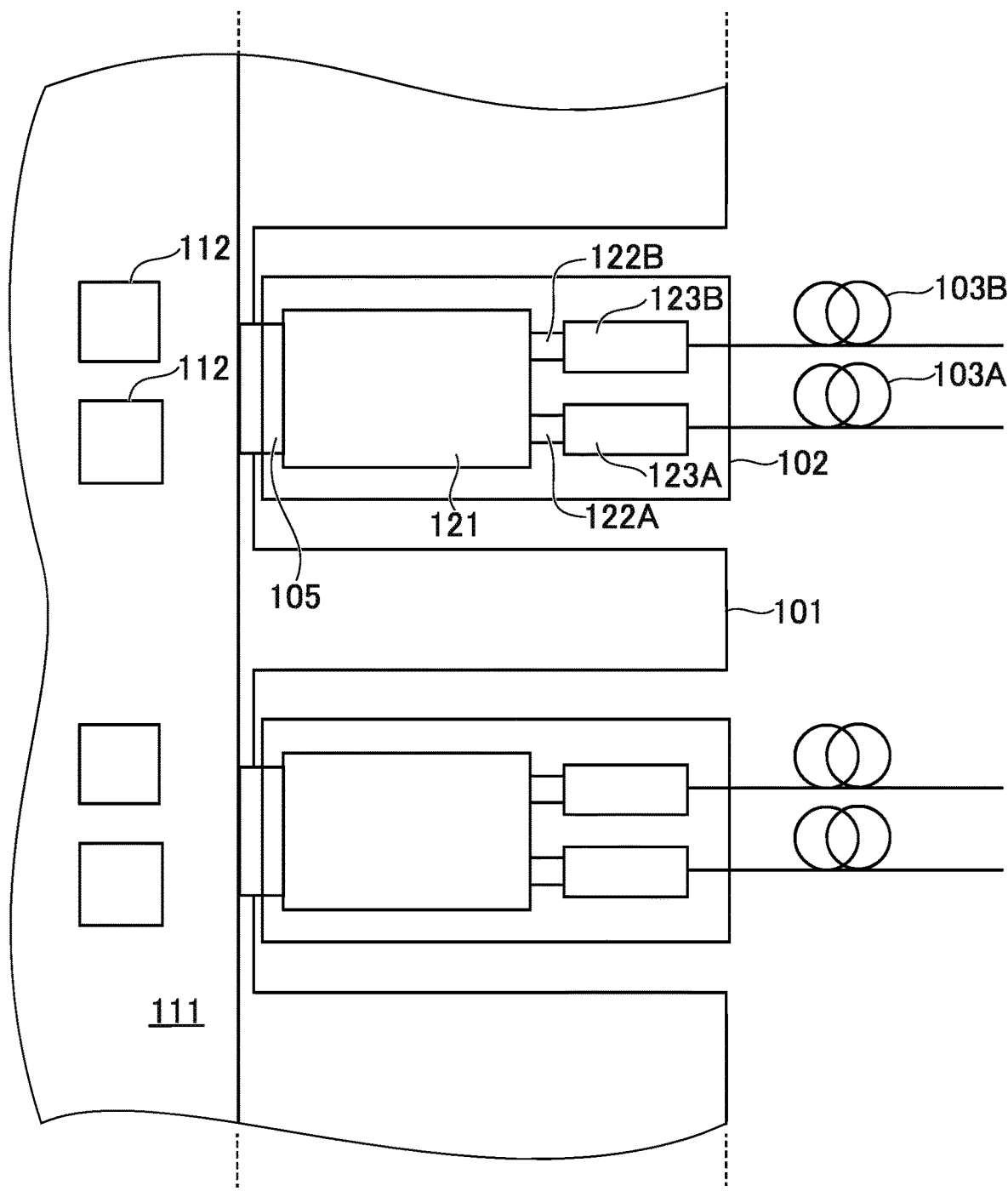
FIG. 1 is a schematic diagram illustrating a configuration of an optical transmission device according to first embodiment of the invention.

Hereinafter, embodiments of the invention will be described specifically and in detail with reference to drawings. In all the drawings for describing the embodiments, the same reference numerals are assigned to members having the same function and repetitive description thereof will be omitted. The following drawings merely illustrate examples of the embodiments, and sizes of the drawings and scales described in the examples do not necessarily coincide with each other.

First Embodiment

FIG. 1 is a schematic diagram illustrating a configuration of an optical transmission device 101 according to the first embodiment of the invention. A plurality of optical modules 102 are mounted on the optical transmission device 101. The optical transmission device 101 includes a printed circuit board 111 and an IC 112. The optical transmission device 101 is, for example, a large capacity router or a switch. The optical transmission device 101 has, for example, a function of a signal exchanger and is disposed in a base station or the like. The optical transmission device 101 acquires data for reception (electric signal for reception) from the optical module 102, determines where to send the data using the IC 112 or the like, generates data for transmission (electric signal for transmission), and transmits the data to corresponding optical module 102 through the printed circuit board 111.

The optical module 102 is a transceiver having a function of transmission and reception. The optical module 102 includes a printed circuit board 121, an optical receiver module 123A which converts an optical signal received through an optical fiber 103A into an electric signal, and an optical transmitter module 123B which converts the electric signal into an optical signal and transmits the optical signal to an optical fiber 103B. The printed circuit board 121 is connected to the optical receiver module 123A and the optical transmitter module 123B through flexible printed circuit boards 122A and 122B, respectively. An electric signal is transmitted from the optical receiver module 123A to the printed circuit board 121 through the flexible printed circuit board 122A, and an electric signal is transmitted from the printed circuit board 121 to the optical transmitter module 123B through the flexible printed circuit board 122B. The optical module 102 and the optical transmission device 101 are connected through an electric port 105.

The transmission system according to the embodiment includes two or more optical transmission devices 101, two or more optical modules 102, and one or more optical fibers 103 (for example, optical fibers 103A, 103B). One or more optical module 102 are mounted on each optical transmission device 101. The optical modules 102 respectively mounted on the two optical transmission devices 101 are connected by the optical fiber 103. An optical module 102 connected to one optical transmission device 101 converts data for transmission, in which the optical transmission device 101 generates, into an optical signal and transmits the optical signal to the optical fiber 103. An optical module 102 connected to the other optical transmission device 101 receives the optical signal transmitted over the optical fiber 103, converts the optical signal into an electric signal, and transmits the electric signal to the other optical transmission device 101 as data for reception.

Here, a bit rate of the electric signal, which is transmitted and received by each optical module 102, is 100 Gbit/s. The optical transmitter module 123B multiplexes four wavelengths of light of 25 Gbit/s with wavelength spacing of approximately 20 nm and transmits the multiplexed signal at 100 Gbit/s using a coarse wavelength division multiplexing (CWDM) method.

Figure 2:
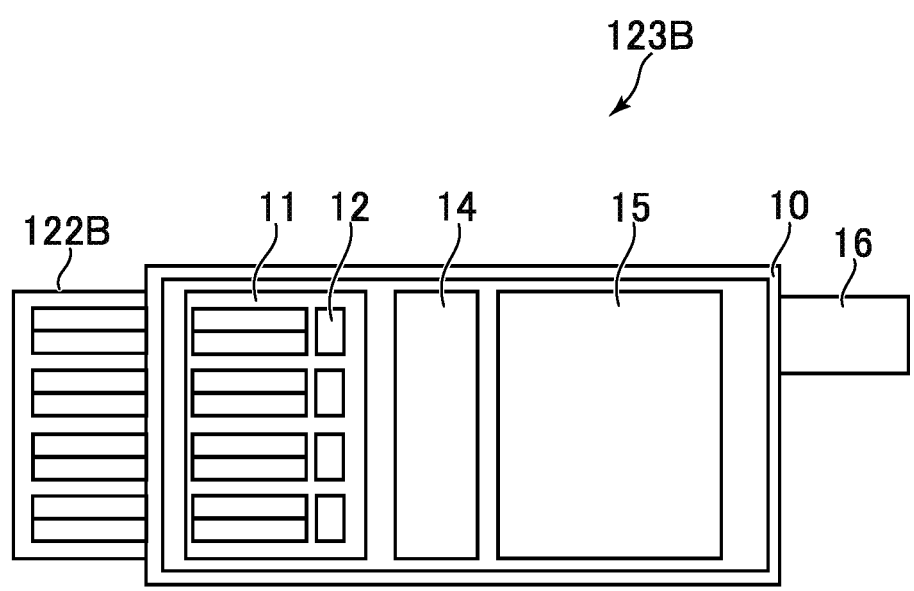
FIG. 2 is a plan view illustrating a configuration of an optical transmitter module according to the first embodiment of the invention.

FIG. 2 is a plan view illustrating a configuration of the optical transmitter module 123B according to the embodiment. The optical transmitter module 123B includes an outer case 10, an arrayed semiconductor optical device 11 (a plurality of semiconductor optical devices 12 are mounted on an arrayed semiconductor optical device 11), an optical component 14 on which a plurality of collective lens are mounted, an optical multiplexer 15, and an optical fiber port 16, and the arrayed semiconductor optical device 11 is connected to the flexible printed circuit board 122B. An electric signal is input to each of the plurality of semiconductor optical devices 12 of the arrayed semiconductor optical device 11 through the flexible printed circuit board 122B. Each semiconductor optical device 12 outputs an optical signal of a corresponding emission wavelength. In the optical component 14, the optical signal output from each semiconductor optical device 12 is collimated by the collective lens which is mounted on the optical component 14 and corresponds to the semiconductor optical device 12, and is multiplexed into a multiplexed optical signal by the optical multiplexer 15. The multiplexed optical signal is output to an optical fiber connected to the optical fiber port 16. The optical transmitter module according to the embodiment includes the arrayed semiconductor optical device according to the embodiment, the optical module according to the embodiment includes the optical transmitter module according to the embodiment, and the optical transmission device according to the embodiment includes the optical module according to the embodiment.

Figure 3A:
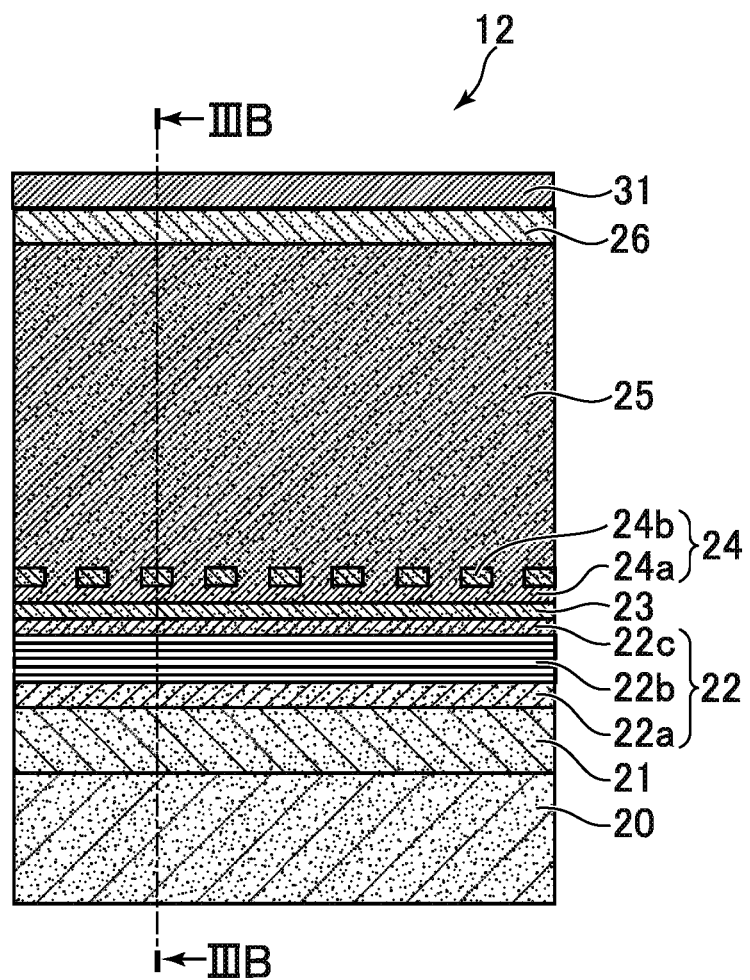
FIG. 3A is a schematic diagram illustrating a semiconductor multilayer structure of a semiconductor optical device according to the first embodiment of the invention.
Figure 3B:
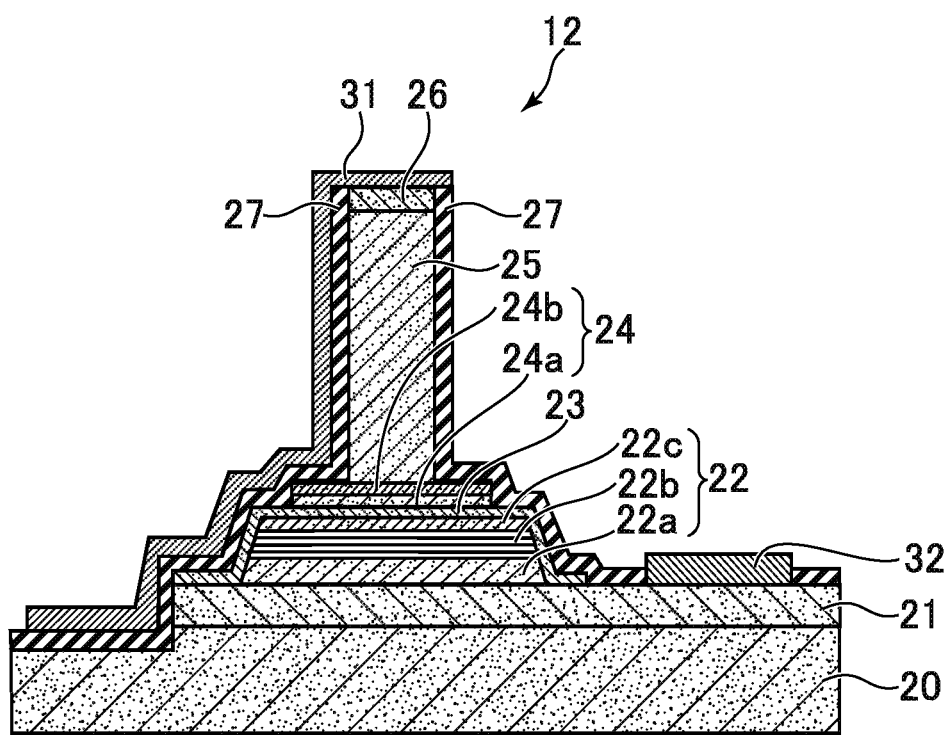
FIG. 3B is a schematic diagram illustrating a semiconductor multilayer structure of a semiconductor optical device according to the first embodiment of the invention.

FIG. 3A and FIG. 3B are schematic diagrams illustrating semiconductor multilayer structures of the semiconductor optical device 12 according to the embodiment. FIG. 3A illustrates a cross section including an optical axis direction of the semiconductor optical device 12, and schematically illustrates the semiconductor multilayer structure. FIG. 3B illustrates a cross section (a surface orthogonal to the optical axis direction) taken along a line IIIB-IIIB illustrated in FIG. 3A, and illustrates a structure of the semiconductor optical device 12.

As illustrated in FIG. 3A, the semiconductor multilayer structure of the semiconductor optical device 12 is a structure in which an n-type InP layer 21, an n-type lower side optical guide layer 22a, an MQW layer 22b, a p-type upper side optical guide layer 22c, a mesa etching stop layer 23, an InP spacer layer 24a, an InGaAsP grating layer 24b, a p-type InP clad layer 25, and a $p^+$-type contact layer 26 are deposited on a semi-insulating Fe-doped InP substrate 20 in order along the deposition direction. Both the n-type lower side optical guide layer 22a and the p-type upper side optical guide layer 22c are an InGaAlAs semiconductor layer. The MQW layer 22b is a semiconductor layer in which an InGaAlAs well layer and an InGaAlAs barrier layer are alternately deposited. The mesa etching stop layer 23 is an InGaAsP semiconductor layer. The $p^+$-type contact layer 26 is an InGaAs semiconductor layer.

As illustrated in FIG. 3B, the semiconductor multilayer structure of the semiconductor optical device 12 is a multistage structure which is composed of a first mesa structure to a third mesa structure from the substrate side. The first mesa structure is composed of the n-type lower side optical guide layer 22a, the MQW layer 22b, the p-type upper side optical guide layer 22c, and the mesa etching stop layer 23. The second mesa structure is composed of the InP spacer layer 24a and the InGaAsP grating layer 24b. The third mesa structure is composed of the p-type InP clad layer 25 and the $p^+$-type contact layer 26. Mesa width is sequentially narrowed from the first mesa structure to the third mesa structure. In the first mesa structure, the mesa etching stop layer 23 is formed so as to cover side surfaces and upper surfaces of the n-type lower side optical guide layer 22a, the MQW layer 22b, and the p-type upper side optical guide layer 22c.

A passivation film 27 is formed over the entire surface of the semiconductor multilayer structure except for a portion of thereof. A p-side electrode 31 electrically connected to the p+-type contact layer 26 and an n-side electrode 32 electrically connected to the n-type InP layer 21 are formed. In order to physically contact the p-side electrode 31 and the p+-type contact layer 26, the passivation film 27 is not formed on the upper surface of the p+-type contact layer 26. In order to physically contact the n-side electrode 32 and the n-type InP layer 21, the passivation film 27 is not formed in a region (at least a portion of the region) of the upper surface of the n-type InP layer 21 on which the n-side electrode 32 is formed.

Here, the first semiconductor layer 22 includes the n-type lower side optical guide layer 22a, the MQW layer 22b, and the p-type upper side optical guide layer 22c. In the embodiment, the first semiconductor layer 22 is composed of the n-type lower side optical guide layer 22a, the MQW layer 22b, and the p-type upper side optical guide layer 22c. The second semiconductor layer 24 includes the InP spacer layer 24a, the InGaAsP grating layer 24b, and an InP cap layer 24c described below. In the embodiment, the second semiconductor layer 24 is composed of the InP spacer layer 24a, the InGaAsP grating layer 24b, and the InP cap layer 24c.

Figure 4A:
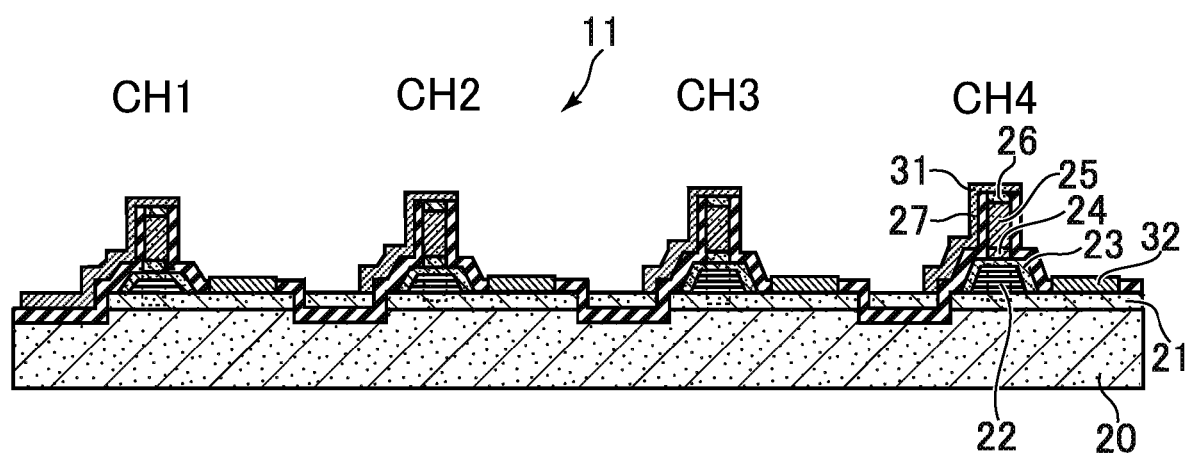
FIG. 4A is a schematic diagram illustrating a structure of an arrayed semiconductor optical device according to the first embodiment of the invention.
Figure 4B:
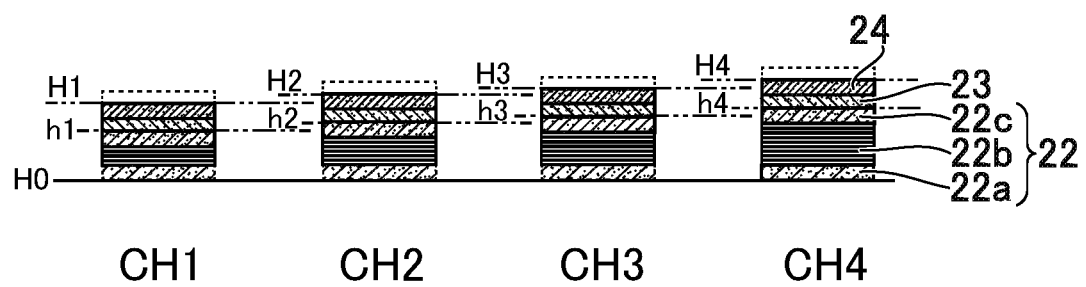
FIG. 4B is a detailed view of main portions of semiconductor multilayer structures of the arrayed semiconductor optical device.

FIG. 4A is a schematic diagram illustrating a structure of the arrayed semiconductor optical device 11 according to the embodiment. The arrayed semiconductor optical device 11 according to the embodiment is a four-channel multiple wavelength laser device array, and each of the semiconductor optical devices 12 is a ridge structure type and direct modulation type semiconductor laser device, specifically, a DFB laser. As illustrated in FIG. 4A, the arrayed semiconductor optical device 11 includes a first semiconductor optical device CH1, a second semiconductor optical device CH2, a third semiconductor optical device CH3, and a fourth semiconductor optical device CH4. Each semiconductor optical device 12 in each channel has the structure illustrated in FIG. 3B. FIG. 4B illustrates main portions of semiconductor multilayer structures of the first semiconductor optical device CH1 to the fourth semiconductor optical device CH4, respectively. The first semiconductor layers 22 of each semiconductor optical device 12 are deposited by Selective-Area-Growth (SAG method), a layer thicknesses of the first semiconductor layers 22 are sequentially increased from the first semiconductor optical device CH1 to the fourth semiconductor optical device CH4, and emission wavelengths (gain peaks) of the first semiconductor layers 22 are sequentially increased from the first semiconductor optical device CH1 to the fourth semiconductor optical device CH4. The layer thicknesses of the first semiconductor layers 22 of the first semiconductor optical device CH1 to the fourth semiconductor optical device CH4 correspond to the distance from H0 which is a height of the lower surface of the first semiconductor layer to h1 to h4, respectively. Accordingly, heights of the upper surfaces of the first semiconductor layers 22 are sequentially increased from the first semiconductor optical device CH1 to the fourth semiconductor optical device CH4 and from h1 to h4. Since the mesa etching stop layer 23 and the second semiconductor layer 24 are simultaneously deposited in a process common to the first semiconductor optical device CH1 to the fourth semiconductor optical device CH4, a layer thickness of the mesa etching stop layer 23 is substantially same in the first semiconductor optical device CH1 to the fourth semiconductor optical device CH4, and a layer thickness of the second semiconductor layer 24 is substantially same in the first semiconductor optical device CH1 to the fourth semiconductor optical device CH4. Accordingly, a height of the upper surface of the InGaAsP grating layer 24b (height of the upper surface of the second semiconductor layer 24) is sequentially increased from the first semiconductor optical device CH1 to the fourth semiconductor optical device CH4 and from H1 to H4.

The features of the present invention may be an arrayed semiconductor optical device in which a plurality of semiconductor optical devices including a first semiconductor optical device and a second semiconductor optical device are monolithically integrated on a semiconductor substrate, that each of the semiconductor optical devices includes a first semiconductor layer having a multiple quantum well layer and a grating layer disposed on the upper side of the first semiconductor layer, and that a layer thickness of the first semiconductor layer of the first semiconductor optical device is thinner than a layer thickness of the first semiconductor layer of the second semiconductor optical device and the height of the grating layer of the first semiconductor optical device is lower than the height of the grating layer of the second semiconductor optical device corresponding to difference in the layer thickness of the first semiconductor layer. The height of the grating layer referred to here is defined as a height along the deposition direction (vertical direction to a substrate surface) from the upper surface of the InP substrate 20. It is desirable that the first semiconductor layer of each of the semiconductor optical devices further includes a lower side optical guide layer disposed in contact with a lower side of the multiple quantum well layer and the upper side optical guide layer disposed in contact with the upper side of the multiple quantum well layer. It is further desirable that the first semiconductor layer of each of the semiconductor optical devices is composed of a lower side optical guide layer, a multiple quantum well layer, and the upper side optical guide layer.

In the embodiment, as described below, first semiconductor layers are deposited by Selective-Area-Growth (SAG) and the layer thicknesses of the first semiconductor layers are different from each other in the first semiconductor optical device CH1 to the fourth semiconductor optical device CH4. On the other hand, since the etching stop layer and the second semiconductor layer are simultaneously deposited by a same crystal growth process under common conditions, a layer thickness of the etching stop layer is substantially the same and a layer thickness of the second semiconductor layer is also substantially the same in the first semiconductor optical device CH1 to the fourth semiconductor optical device CH4. Accordingly, difference in heights between the grating layer of the first semiconductor optical device and the grating layer of the second semiconductor optical device is substantial difference in the layer thickness of the first semiconductor layer. It is further desirable that each semiconductor optical device includes the etching stop layer disposed between the first semiconductor layer and the grating layer. In a plurality of semiconductor optical devices, when a layer thickness of certain semiconductor layers is same each other, it indicates that the semiconductor layers are simultaneously deposited by a same crystal growth process under common conditions, so that the layer thicknesses of the semiconductor layers in the crystal growth process are substantially same. That is, it means that the layer thicknesses of the semiconductor layers are same within in-plane distribution of the semiconductor layers by the crystal growth process.

Increase of the transmission capacity of information is required due to the explosive growth of the Internet population in recent years, and it is expected that optical communication will still play an important role in the future. A semiconductor laser device is used as a light source for transmission in the optical communication and is mounted on a standardized package as an optical module together with an electric circuit for driving a device and the like. At present, transmission capacity of an optical module has already reached 100 Gbit/s. As in the case of the arrayed semiconductor optical device 11 according to the embodiment, transmission capacity of 100 Gbit/s is realized by arraying four semiconductor optical devices (four channels) operating at 25 Gbit/s and having mutually different emission wavelengths. A transmission speed of each semiconductor optical device reaches 25 Gbit/s and is thought to be a performance close to the limit of the device. So, it is technically not easy to further increase the transmission speed in a short period of time. Accordingly, for large capacity of an optical module, it is considered that a method which arrays semiconductor optical devices having a plurality of channels (n pieces) and mounts the arrayed semiconductor optical device on an optical module is desirable to increase transmission capacity (by n times) in the future. The arrayed semiconductor optical device according to the embodiment has an optimum structure to fulfill the demand for large capacity and small size of the arrayed semiconductor optical device.

On the other hand, in an optical transmission device used in a data center or the like, since a space of an optical module mounted on the optical transmission device is limited, it is also important to improve transmission density. For such purpose, it is desirable to increase the number of optical modules mounted on the same space by miniaturizing the optical module itself. Accordingly, demands for miniaturizing of optical modules are rapidly increasing. The optical module and the optical transmission device according to the embodiment have optimum structures to fulfill the demand for large capacity and small size of the optical module.

Figure 5:
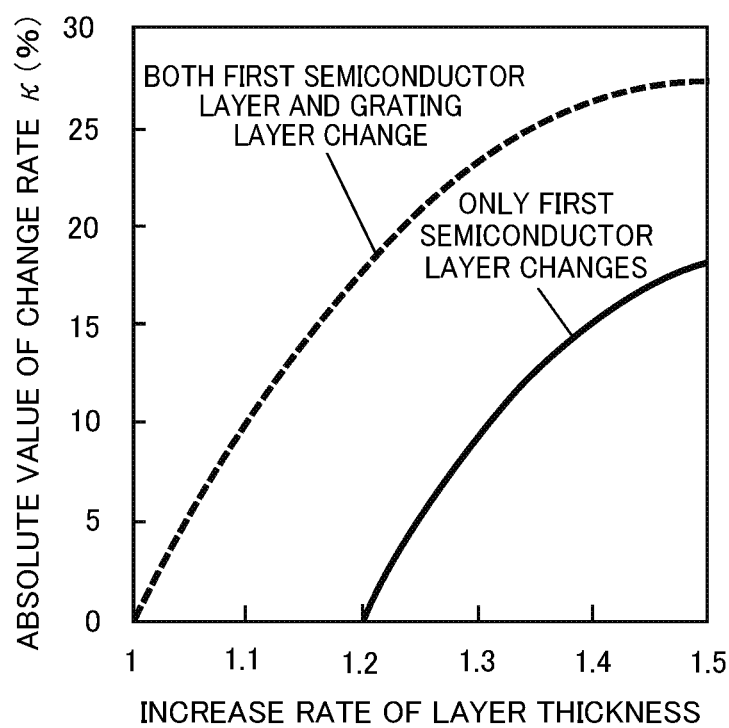
FIG. 5 is a graph illustrating an absolute value of a change rate of coupling coefficient κ with respect to an increase rate of a layer thickness in a first semiconductor layer and a grating layer of a semiconductor optical device.

FIG. 5 is a graph illustrating an absolute value of a change rate of coupling coefficient κ with respect to an increase rate of a layer thickness in a first semiconductor layer and a grating layer of a semiconductor optical device. It is generally known that performance of a grating is represented by a product κL of coupling coefficient κ and cavity length L. The κ is proportional to difference in effective refractive index between a region in which the grating layer is present and a region in which the grating layer is not present. Here, it is assumed that the semiconductor optical device has a standard device structure, and four channels (four) semiconductor optical devices are integrated in an arrayed semiconductor optical device.

In the semiconductor optical device fabricated by Selective-Area-Growth illustrated in JP 07-226563A, the first semiconductor layer and the grating layer are continuously deposited by Selective-Area-Growth, and both the layer thickness of the first semiconductor layer and the layer thickness of the grating layer increase between channels. In this case, the absolute value of the change rate of the κ varies significantly as illustrated by the broken line in FIG. 5, and the inventors have obtained findings that the device performance varies between the channels. Difference in the absolute value of the change rate of the κ is the largest between the first semiconductor optical device CH1 and the fourth semiconductor optical device CH4 in which both difference in the layer thickness of the first semiconductor layer and difference in layer thickness of the grating layer are maximized, and difference in the device performance also becomes large. The wavelength change of Selective-Area-Growth is caused by the increase in the layer thickness in principal, and it is not easy to reduce the change of the κ.

On the other hand, in the semiconductor optical device according to the embodiment, since the layer thicknesses of the grating layers are substantially constant between channels, only layer thicknesses of the first semiconductor layers increase between channels. In this case, the absolute value of the change rate of the κ becomes smaller as a solid line illustrated in FIG. 5 as compared with the case where both the layer thickness of the first semiconductor layer and the layer thickness of the grating layer increase (broken line). The change rate of the κ is estimated to be substantially negligible until the increase rate of the layer thickness of the first semiconductor layer is about 1.2 times. Since the change in layer thickness in the grating layer having a high refractive index is suppressed, the amount of change in the refractive index of the entire semiconductor multilayer structure can be significantly reduced. As a result, a variation of the change rate of the κ between channels can be reduced as compared with the prior art, and variations in device performance between the channels can be suppressed.

In the arrayed semiconductor optical device according to the embodiment, since the layer thicknesses of the grating layers are substantially constant between channels, the semiconductor optical device can be fabricated with high accuracy as compared with the case where the first semiconductor layer and the grating layer are continuously deposited by conventional Selective-Area-Growth, and it is possible to further suppress the variations in device performance between the channels. Hereinafter, this will be described.

In a case where an InP semiconductor substrate is used, a grating layer is formed of a quaternary alloy layer such as InGaAsP or InGaAlAs, and is buried in an InP layer. A manufacturing process of a semiconductor optical device includes an etching process of the grating layer (typically, a quaternary alloy layer having a layer thickness of several tens of nanometers). According to the conventional Selective-Area-Growth, the layer thicknesses of the grating layers are different between channels so that etching conditions are different between channels. Therefore, it is difficult to simultaneously form gratings having desired pitches and shapes in the semiconductor optical devices of all the channels by a common etching process. When difference in the layer thicknesses of the grating layers becomes large between channels, it is more difficult to fabricate uniform grating. The nonuniformity of the shapes of the gratings is a cause of increasing variation in device performance between the channels. It is possible to perform etching under each optimum etching conditions for each channel by several etching steps. However, in this case, the number of processes involved in etching increases, which is undesirable from the viewpoint of cost reduction. In the arrayed semiconductor optical device according to the embodiment, the layer thicknesses of the grating layers are substantially constant between channels and the gratings can be simultaneously formed by a common etching process. The shapes of the gratings can be formed more uniformly, and the manufacturing cost can also be reduced.

The structure of the arrayed semiconductor optical device 11 according to the embodiment has been described above. Next, a manufacturing method of the arrayed semiconductor optical device 11 according to the embodiment will be described. MOVPE is used as a crystal growth method of a semiconductor layer. Hydrogen is used as a carrier gas. Either one of triethylgallium (TEG), trimethylindium (TMI), or trimethylaluminum (TMA), or a combination thereof is used as a source material of the group III element. Either one of arsine ($AsH_3$) or phosphine ($PH_3$), or a combination thereof is used as a source material of the group V element.

Disilane ($Si_2H_6$) is used as a source material of the n-type dopant. Dimethylzinc (DMZn) is used as a source material of the p-type dopant. Cyclopentadienyl magnesium ($Cp_2Mg$) is also used as a source material of the p-type dopant. The manufacturing method of the optical transmitter module according to the embodiment is realized by mounting the arrayed semiconductor optical device according to the embodiment using a known mounting method. The manufacturing method of the optical module according to the embodiment is realized by mounting the optical transmitter module according to the embodiment using a known mounting method. The manufacturing method of the optical transmission device according to the embodiment is realized by mounting the optical module according to the embodiment using a known mounting method.

The crystal growth method is not limited to MOVPE. It goes without saying that the effect of the present invention can be obtained using Molecular Beam Epitaxy (MBE), Chemical Beam Epitaxy (CBE), Metal-organic Molecular Beam Epitaxy (MOMBE), or the like as long as the same structure can be manufactured by these methods. Materials other than above-mentioned source materials may also be used as materials of group III, group V, dopants, and the like.

Figure 6A:
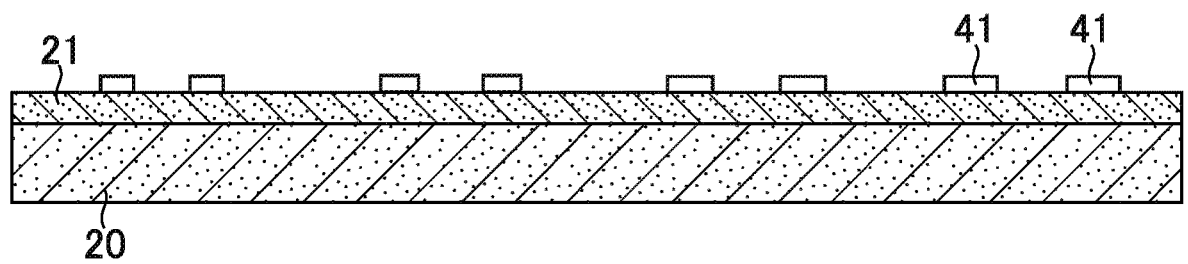
FIGS. 6A to 6L are diagrams illustrating processes of a manufacturing method of the arrayed semiconductor optical device according to the first embodiment of the invention.

FIGS. 6A to 6L are diagrams illustrating a process of the manufacturing method of the arrayed semiconductor optical device 11 according to the embodiment. The n-type InP layer 21 is formed on the Fe-doped InP substrate 20. A pair of the insulator masks 41 for each channel (a total of four pairs of insulator masks 41) is formed on the upper surface of the n-type InP layer 21 so as to realize a desired wavelength change (insulator mask forming process: FIG. 6A). The pair of the insulator masks 41 is disposed so as to sandwich a region where the first semiconductor layer 22 to be disposed in a later process. The emission wavelength of the MQW layer 22b of the first semiconductor layer 22 depends on spacing (opening) of the pair of the insulator masks 41 and mask width. Accordingly, the spacing of the pair of the insulator masks 41 and the mask width for each channel are determined such that the layer thickness of the first semiconductor layer 22 increases from the first semiconductor optical device CH1 to the fourth semiconductor optical device CH4.

Figure 6B:
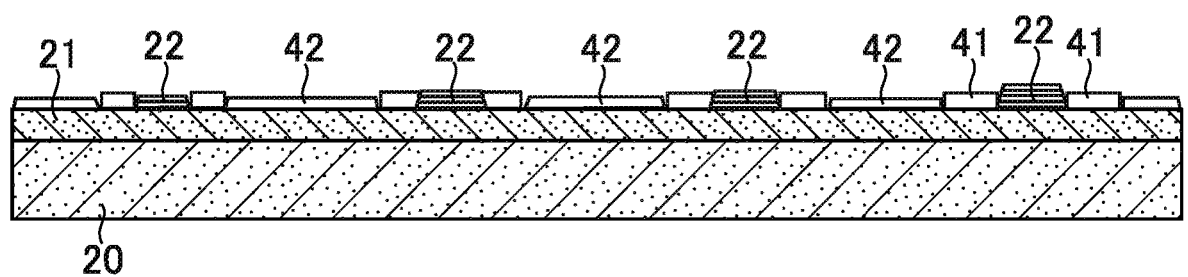

The first semiconductor layer 22 is deposited on the Fe-doped InP substrate 20 (SAG growth process: FIG. 6B). In the SAG growth process, although a protective layer (InP cap layer) is usually deposited on the upper side of the first semiconductor layer 22, it is omitted to illustrate in FIG. 6B. The layer thickness of the first semiconductor layer 22 increases from the first semiconductor optical device CH1 to the fourth semiconductor optical device CH4 by the pair of insulator masks 41 of each channel. That is, the first semiconductor layer 22 of the first semiconductor optical device CH1 and the first semiconductor layer 22 of the second semiconductor optical device CH2 are simultaneously deposited such that the layer thickness of the first semiconductor layer 22 of the first semiconductor optical device CH1 is thinner than that of the first semiconductor layer 22 of the second semiconductor optical device CH2. The first semiconductor layer deposition process according to the embodiment includes the insulator mask forming process and the SAG growth process. In addition to the first semiconductor layer 22 of each channel, a dummy semiconductor layer 42 is simultaneously formed in each region between the channels.

Figure 6C:
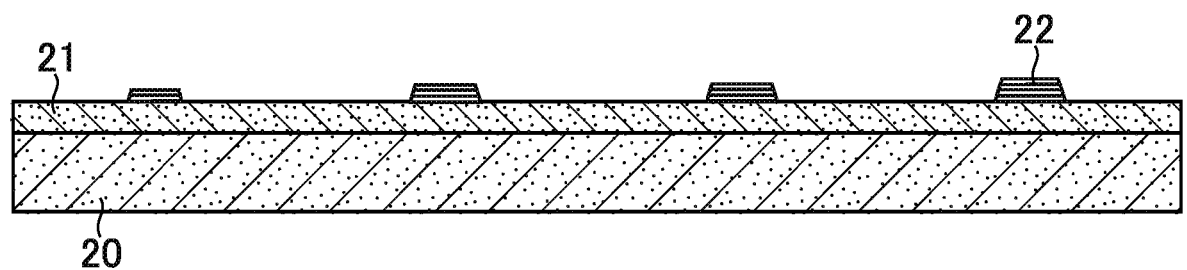

The pair of the insulator masks 41 of each channel and the dummy semiconductor layer 42 formed in each region between channels are removed (insulator mask removing process: FIG. 6C). The protective layer deposited on the upper side of the first semiconductor layer 22 is removed before the etching stop layer deposition process is performed.

Figure 6D:
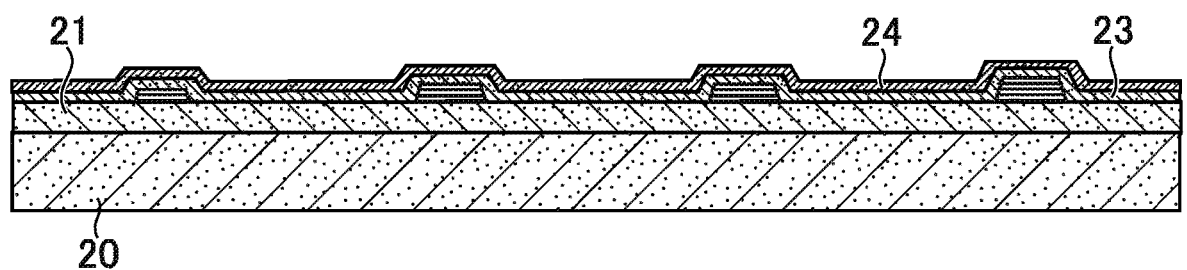

The mesa etching stop layer 23 (etching stop layer deposition process) and the second semiconductor layer 24 (grating layer deposition process) are continuously deposited on the Fe-doped InP substrate 20 so as to cover the first semiconductor layer 22 (FIG. 6D). The mesa etching stop layer 23 and the second semiconductor layer 24 are formed over the entire surface of the Fe-doped InP substrate 20. The mesa etching stop layer 23 is deposited to form the first mesa structure. Since the mesa etching stop layer 23 of the semiconductor optical device 12 of each channel can be formed under a same growth condition, the layer thickness of the mesa etching stop layer 23 of each channel is substantially same. Each of the second semiconductor layers 24 of the first semiconductor optical device CH1 to the fourth semiconductor optical device CH4 is simultaneously deposited under common growth conditions. Since the second semiconductor layers 24 of the semiconductor optical device 12 of each channel can be formed under the same growth condition, the layer thickness of the second semiconductor layers 24 of each channel is substantially same.

Figure 6E:
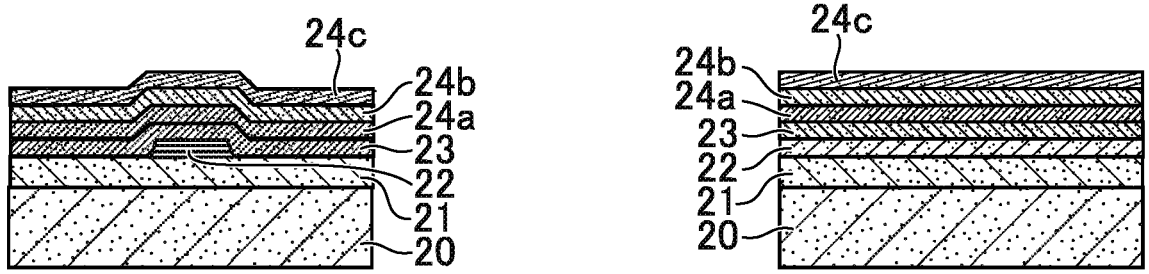

FIG. 6E illustrates a structure of one semiconductor optical device 12 among the arrayed semiconductor optical devices 11 illustrated in FIG. 6D. FIG. 6E on the left side illustrates a cross section perpendicular to the optical axis direction similarly to FIG. 6D. FIG. 6E on the right side illustrates a cross section including the optical axis direction similarly to FIG. 3A. The same applies to FIGS. 6F to 6I. As illustrated in FIG. 6E, the second semiconductor layer 24 includes the InP spacer layer 24a, the InGaAsP grating layer 24b, and the InP cap layer 24c.

Figure 6F:
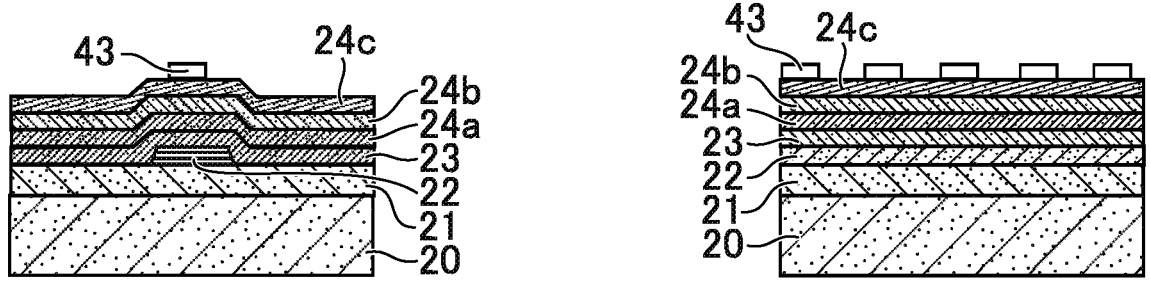

The oxide mask 43, which is a grating pattern mask, is formed in the upper portion of a region of the InGaAsP grating layer 24b formed over the entire surface in which the MQW layer 22b forms as an optical waveguide in each channel (grating pattern mask forming process: FIG. 6F). The oxide mask 43 is deposited and the deposited oxide mask 43 is processed into a grating pattern having a periodic structure by interference exposure method, electron beam exposure method, or the like. As illustrated in FIG. 6F on the right side, a region in which a grating is formed and a region in which a grating is not formed are periodically repeated along the optical axis direction and forms the grating pattern.

Figure 6G:
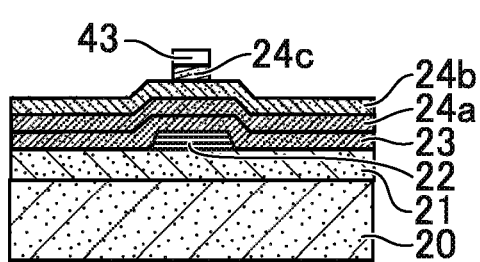
Figure 6G:
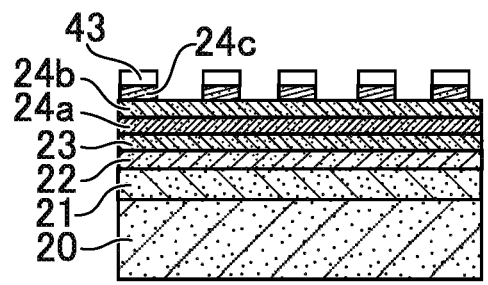
Figure 6H:
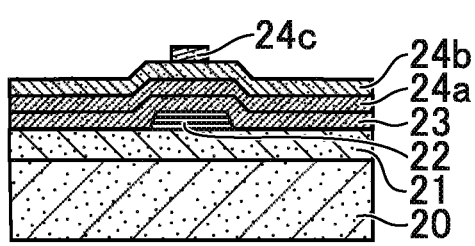
Figure 6H:
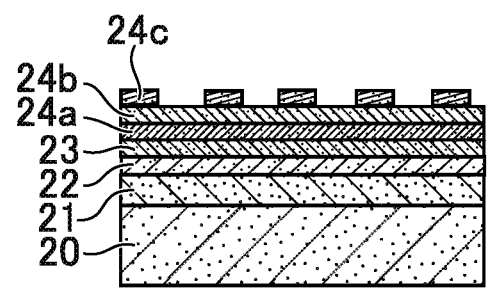

The InP cap layer 24c is etched using the oxide mask 43 as a mask (InP cap layer etching process: FIG. 6G). As illustrated in FIG. 6G, etching conditions are adjusted such that etching stops at the upper surface of the InGaAsP grating layer 24b. Next, the oxide mask 43 is removed (oxide mask removing process: FIG. 6H).

Figure 6I:
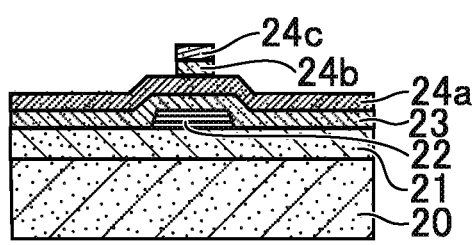
Figure 6I:
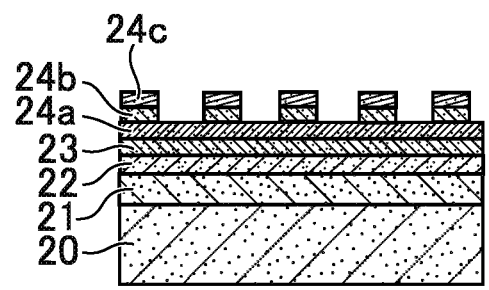

The InGaAsP grating layer 24b is etched using the InP cap layer 24c as a mask and a grating is formed (grating forming process: FIG. 6I). At this time, etching conditions are adjusted such that the InP spacer layer 24a functions as an etching stop layer and etching stops at the upper surface of the InP spacer layer 24a. In this process, the second mesa structure is formed.

Figure 6J:
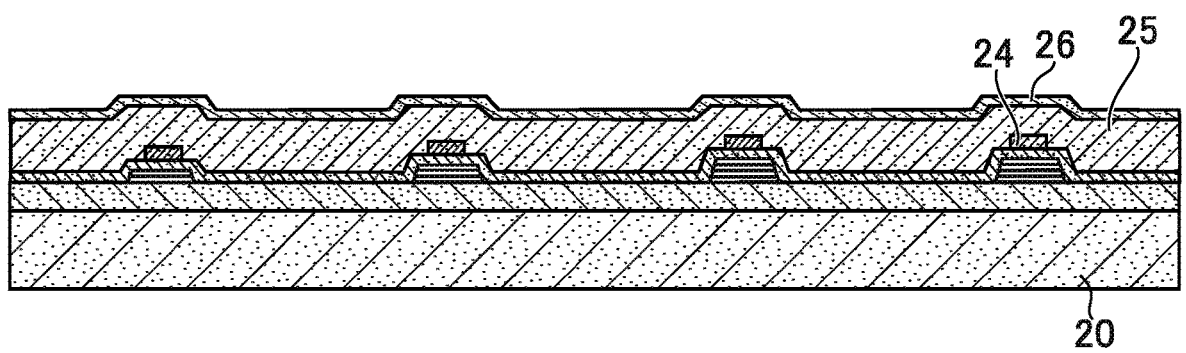

The p-type InP clad layer 25 and the $p^+$-type contact layer 26 are continuously deposited over the entire surface of the Fe-doped InP substrate 20 (upper side clad layer deposition process: FIG. 6J). In this process, all the crystal growth processes are completed. At this time, since the InP cap layer 24c disposed on the InGaAsP grating layer 24b (grating) is integrated with the p-type InP clad layer 25, the InP cap layer 24c is not illustrated. Similarly, since the InP spacer layer 24a is also integrated with the p-type InP clad layer 25, the InP spacer layer 24a is not illustrated. The InP spacer layer 24a is formed under the InGaAsP grating layer 24b, and the InP spacer layer 24a and the InGaAsP grating layer 24b in this portion are illustrated as the second semiconductor layer 24.

Figure 6K:
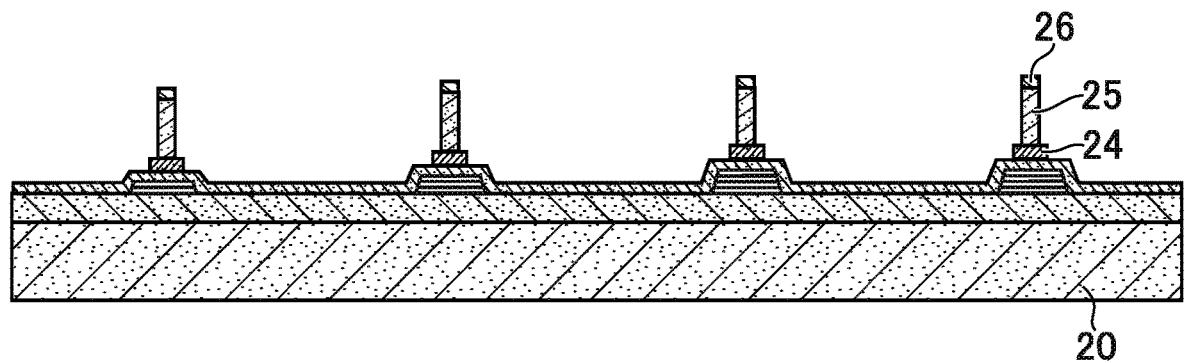

A mask is formed on the upper surface of the p$^+$-type contact layer 26 and etching is performed using the mask to remove regions of the p$^+$-type contact layer 26 and the p-type InP clad layer 25 which exist on both sides of the mask, thereby forming the third mesa structure (ridge structure) (mesa forming process: FIG. 6K). An appropriate etching method such as wet etching or dry etching is selected and etching conditions are adjusted such that etching stops at the upper surface of the mesa etching stop layer 23. As illustrated in FIG. 3B, the etching stops at the upper surface of the InGaAsP grating layer 24b in a region in which the InGaAsP grating layer 24b is formed. In a region on the same layer as the InGaAsP grating layer 24b and in which InGaAsP grating layer 24b is not formed, the etching further proceeds and stops at the upper surface of the mesa etching stop layer 23.

Figure 6L:
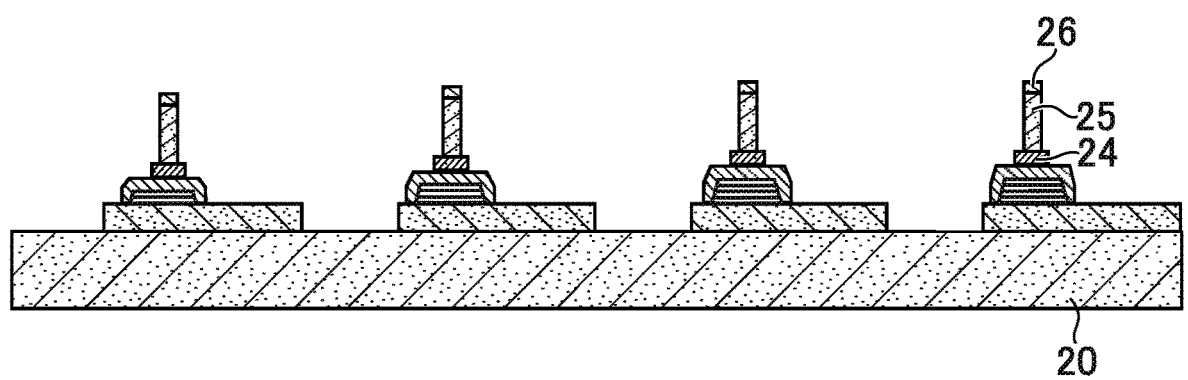

A region of the mesa etching stop layer 23 which is an outside of the first mesa structure is removed to expose a region of the n-type InP layer 21 in which the n-side electrode 32 is formed (mesa etching stop layer removing process: FIG. 6L). The n-type InP layers 22, which are formed in regions between channels, are removed to electrically isolate the channels, and the upper portion of the Fe-doped InP substrate 20 in the region is removed to reach the inside of the Fe-doped InP substrate 20. The passivation film 27 is formed over the entire surface of the Fe-doped InP substrate 20. The passivation film 27 existed on the upper surface of the p$^+$-type contact layer 26, which is a contact portion of the p-side electrode 31 and at a contact portion with n-side electrode 32 in the upper surface of the exposed n-type InP layer 21 is removed to form the p-side electrode 31 and the n-side electrode 32, and wafer processes are completed. The arrayed semiconductor optical device 11 according to the embodiment is fabricated by cleaving from the wafer.

In the arrayed semiconductor optical device 11 fabricated in this manner, since adjacent channels are electrically insulated, differential drive is possible. When device performance of the arrayed semiconductor optical device 11 is characterized, variations in threshold current and slope efficiency at high temperature operation between the four channels are small, and the modulation characteristic under 25 Gbit/s operation is also good.

Second Embodiment

The arrayed semiconductor optical device 11 according to a second embodiment of the present invention is, similarly to the first embodiment, a ridge structure type four-channel multiple wavelength laser device array, and each semiconductor optical device 12 is a semiconductor laser device that outputs a continuous wave (CW), specifically, a DFB laser. A plurality of electro-absorption (EA) modulators that modulate and output the continuous waves from each of the plurality of the semiconductor optical devices 12 are also monolithically integrated into the arrayed semiconductor optical device 11. That is, each semiconductor optical device 12 is a laser portion of the EA modulator integrated DFB laser. The arrayed semiconductor optical device 11 according to the first embodiment includes the Fe-doped InP substrate 20, and the n-side electrode 32 is formed on the same side with respect to the p-side electrode 31 and the semiconductor substrate. On the other hand, the arrayed semiconductor optical device 11 according to the embodiment includes an n-type InP substrate 50, and an n-side electrode 62 is formed on the opposite side to a p-side electrode 61 with respect to the semiconductor substrate. Accordingly, a semiconductor multilayer structure of each semiconductor optical device 12 is different from that of the first embodiment, but other structures are the same as that of the first embodiment.

Figure 7:
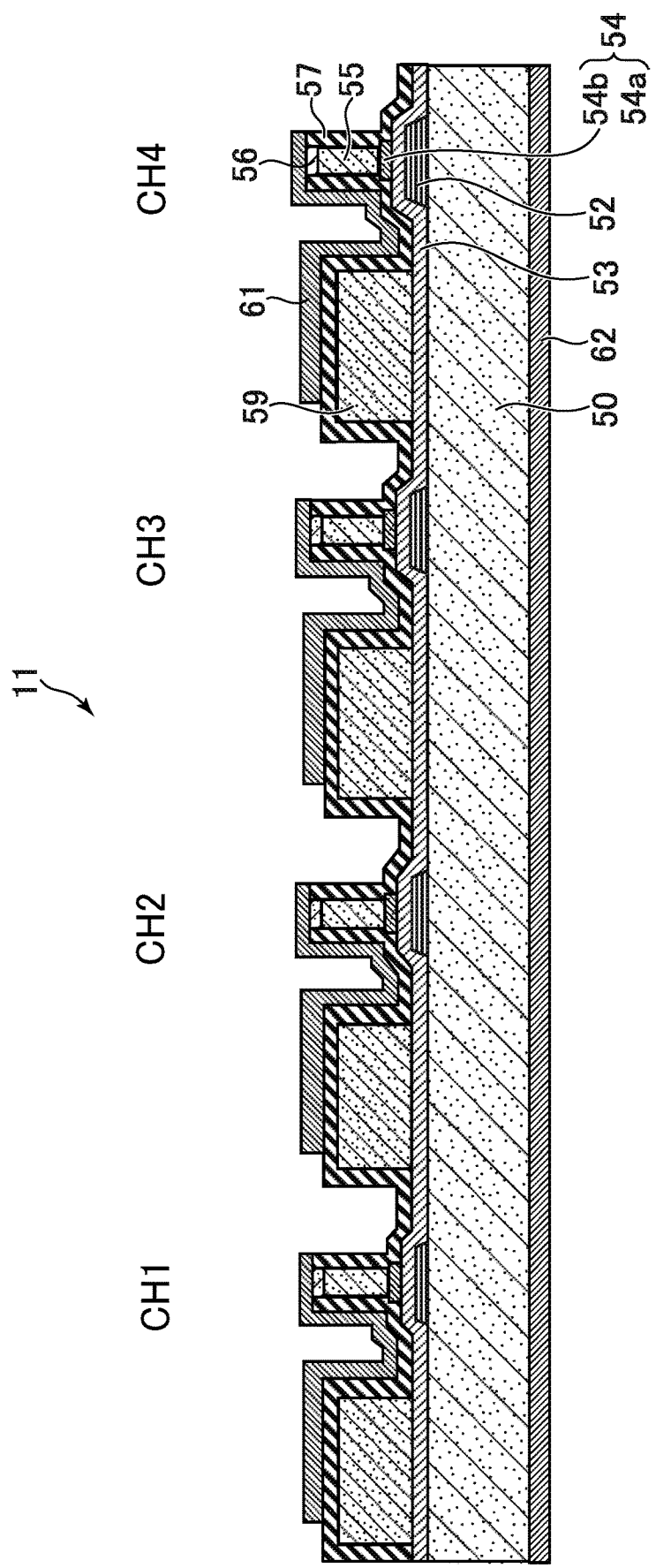
FIG. 7 is a schematic diagram illustrating a structure of the arrayed semiconductor optical device according to the second embodiment of the invention.

FIG. 7 is a schematic diagram illustrating a structure of the arrayed semiconductor optical device 11 according to the embodiment. In the semiconductor multilayer structure of the semiconductor optical device 12, an n-type lower side optical guide layer 52a, an MQW layer 52b, a p-type upper side optical guide layer 52c, a mesa etching stop layer 53, an InP spacer layer 54a, an InGaAsP grating layer 54b, a p-type InP clad layer 55, and p$^+$-type contact layer 56 are deposited on the n-type InP substrate 50 in order along the growth direction. Both the n-type lower side optical guide layer 52a and the p-type upper side optical guide layer 52c are an InGaAsP semiconductor layer. The MQW layer 52b is a semiconductor layer in which an InGaAsP well layer and an InGaAsP barrier layer are alternately deposited. The mesa etching stop layer 53 is the InGaAsP semiconductor layer. The p$^+$-type contact layer 56 is an InGaAs semiconductor layer. The first semiconductor layer 52, similarly to the first embodiment, includes an n-type lower side optical guide layer 52a, an MQW layer 52b, and a p-type upper side optical guide layer 52c, and the second semiconductor layer 54 includes an InP spacer layer 54a, an InGaAsP grating layer 54b, and an InP cap layer (not illustrated). A bank portion 59, which is simultaneously deposited in a crystal growth process of the p-type InP clad layer 55 (and the p$^+$-type contact layer 56), is disposed on one side (left side of FIG. 7) of each semiconductor optical device 12. The p$^+$-type contact layer 56 is also formed on the uppermost layer of the bank portion 59, but it is removed before a passivation film 57 described later is formed. The passivation film 57 is formed over the entire surface of the n-type InP substrate 50 except for the upper surface of the p$^+$-type contact layer 56 which is a contact portion of the p-side electrode 61. The p-side electrode 61 is in contact with the upper surface of the p$^+$-type contact layer 56, and extends to one side of each semiconductor optical device 12 to form a pad portion on the upper surface of the bank portion 59. Further, the n-side electrode 62 is formed on a back surface of the n-type InP substrate 50.

In a manufacturing method of the arrayed semiconductor optical device 11 according to the embodiment, since the characteristic processes according to the present invention are common with the manufacturing method of the arrayed semiconductor optical device 11 according to the first embodiment, details will be omitted. In a case where the third mesa structure (ridge structure) of the semiconductor multilayer structure is formed by etching, etching conditions are adjusted such that the etching stops at the upper surface of the mesa etching stop layer 53. Between the third mesa structure (ridge structure) of the semiconductor multilayer structure and the bank portion 59 (pad portion of p-side electrode 61) may be planarized with polyimide, BCB, or the like.

Ground potential (ground) in each channel of the arrayed semiconductor optical device 11 according to the embodiment is the n-type InP substrate 50 (and the n-side electrode 62), which is common for all channels. The arrayed semiconductor optical device 11 fabricated in this manner can be used as a CW light source. When device performance of the arrayed semiconductor optical device 11 is characterized, variations in threshold current and slope efficiency at high temperature operation between the four channels are small, and it is possible to reduce variation in optical output between channels. Here, although the arrayed semiconductor optical device 11 according to the embodiment includes the n-type InP substrate 50, the arrayed semiconductor optical device 11 according to the embodiment is not limited to this and may include a p-type InP substrate.

Third Embodiment

An arrayed semiconductor optical device 11 according to a third embodiment of the invention is, similarly to the first embodiment, a four-channel multiple wavelength laser device array, and each semiconductor optical device 12 is a buried hetero structure type and direct modulation type semiconductor laser device, specifically, a DFB laser. By employing the buried hetero structure type, a semiconductor multilayer structure of semiconductor optical device 12 according to the embodiment is different from that of the first embodiment and a shape of the p-side electrode 31 is also different from that of the first embodiment, but other structures are the same as that of the first embodiment.

FIG. 8 is a schematic diagram illustrating a structure of the arrayed semiconductor optical device 11 according to the embodiment. In the semiconductor multilayer structure of the semiconductor optical device 12 according to the embodiment, an n-type InP layer 21, an n-type lower side optical guide layer 22a, an MQW layer 22b, a p-type upper side optical guide layer 22c, an InP spacer layer 24a, an InGaAsP grating layer 24b, a p-type InP clad layer 25, and a $p^+$-type contact layer 26 are deposited on an Fe-doped InP substrate 20 in order along the growth direction. The mesa etching stop layer 23, which is deposited between the first semiconductor layer 22 and the second semiconductor layer 24 in the first embodiment, is not deposited in the embodiment.

In the first embodiment, the semiconductor multilayer structure is the multistage structure. However, in the embodiment, the semiconductor multilayer structure placed on both sides of a region of the MQW layer 22b in which an optical waveguide is formed is removed from the $p^+$-type contact layer 26 to the n-type InP layer 21, thereby forming a mesa stripe structure. The both sides of the mesa stripe structure are buried with a buried layer 28. Here, the buried layer 28 is a semi-insulating InP layer in which iron (Fe) is doped and ferrocene is used as an organometallic source material of iron. The buried layer 28 may be a semi-insulating InP layer in which ruthenium (Ru) is doped.

In the arrayed semiconductor optical device 11 fabricated in this manner, since adjacent channels are electrically isolated, differential drive is possible. When device performance of the arrayed semiconductor optical device 11 is characterized, variations in threshold current and slope efficiency at high temperature operation between the four channels are small, and the modulation characteristic under 25 Gbit/s operation is also good.

The semiconductor optical device, the arrayed semiconductor optical device, the optical transmitter module, the optical module, the optical transmission device, and the method for manufacturing thereof according to embodiments of the invention have been described above. In the above embodiments, a direct modulation laser and a CW DFB laser are described as examples of the semiconductor optical device, but it goes without saying that the semiconductor optical device is not limited to these and it is widely applicable to a semiconductor optical device including grating on the upper side of the first semiconductor layer. The mesa etching stop layer may be provided if necessary, and a mesa formation may be performed by using the grating layer as a mesa etching stop layer. Further, the present invention is not limited to the four-channel array and is applicable as long as it is an array device in which two or more semiconductor optical devices 12 are integrated. In the arrayed semiconductor optical device according to the above embodiments, the InP semiconductor substrate is used, but the substrate is not limited to this and other semiconductor substrates may be used. The first semiconductor layer according to the above embodiments has a three-layer structure including the lower side optical guide layer, the MQW layer, and the upper side optical guide layer, but the structure is not limited to this. As necessary, the first semiconductor layer according to the above embodiments may have only the MQW layer or may have a structure in which a semiconductor layer is further deposited in addition to the three layers.

The first semiconductor layer of the semiconductor optical device is deposited by Selective-Area-Growth (SAG), and the second semiconductor layer is simultaneously deposited by a common process between channels, but the crystal growth method of the first semiconductor layer is not limited to Selective-Area-Growth. Other crystal growth methods are applicable as long as the layer thickness of the first semiconductor layer of the first semiconductor optical device can be simultaneously deposited as being thinner than the layer thickness of the first semiconductor layer of the second semiconductor optical device. The arrayed semiconductor optical device having a bit rate to be transmitted of 100 Gbit/s is described as an example, but it goes without saying that the bit rate is not limited to this and other bit rates or symbol rates can be applied. The present invention can be widely applied.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A manufacturing method of an arrayed semiconductor optical device, the arrayed semiconductor optical device comprising a plurality of semiconductor optical devices comprising a first semiconductor optical device and a second semiconductor optical device, the method comprising:
    forming a first conductivity type semiconductor layer on a semiconductor substrate;
    forming a plurality pairs of masks for the plurality of semiconductor optical devices on an upper side of the first conductivity type semiconductor layer, each of the plurality pairs of masks being disposed sandwiching a region for the corresponding semiconductor optical device, the plurality pairs of masks comprising a first pair of masks for the first semiconductor optical device and a second pair of masks for the second semiconductor optical device;
    forming a first semiconductor layer comprising a multiple quantum well layer entirely over the semiconductor substrate;
    removing the plurality pairs of masks and portions of the first semiconductor layer located between adjacent pairs of masks out of the plurality pairs of masks;

forming a mesa etching stop layer and a second semiconductor layer in this order entirely over the semiconductor substrate so as to cover the first semiconductor layer, the second semiconductor layer comprising a grating layer:

forming gratings for the plurality of semiconductor optical devices by processing the grating layer, respectively;

forming a second conductivity type clad layer and a second conductivity type contact layer in this order entirely over the semiconductor substrate;

forming a plurality of mesa masks on an upper surface of the second conductivity type contact layer; and performing an etching using the plurality of mesa masks to remove regions of the second conductivity type contact layer and the second conductivity type clad layer on both sides of the plurality of mesa masks, respectively, wherein in the forming a first semiconductor layer, a layer thickness of the first semiconductor layer of the first semiconductor optical device is thinner than a layer thickness of the first semiconductor layer of the second semiconductor optical device due to spacings of the first and second pairs of masks and mask widths of the first and second pairs of the masks, and wherein in the forming a mesa etching stop layer and a second semiconductor layer, a first mesa structure including the first semiconductor layer and the mesa etching stop layer is formed for each of the plurality of semiconductor optical devices, respectively.

2. The manufacturing method of the arrayed semiconductor optical device according to claim 1, the forming gratings comprising:

forming a cap layer on an upper surface of the grating layer;

forming a plurality of grating pattern masks on an upper surface of the cap layer for the plurality of semiconductor optical devices, respectively;

etching the cap layer using the plurality of grating patter masks to remove regions of the grating layer where the plurality of grating pattern masks are not disposed;

removing the plurality of grating pattern masks;

etching the grating layer using the cap layer as masks to form the gratings, wherein in the etching the grating layer, a second mesa structure of the second semiconductor layer is formed for each of the plurality of semiconductor optical devices.

3. The manufacturing method of the arrayed semiconductor optical device according to claim 2, wherein in the performing an etching using the plurality of mesa masks, a third mesa structure including the second conductivity type clad layer and the second conductivity type contact layer is formed for each of the plurality of semiconductor optical devices.

4. The manufacturing method of the arrayed semiconductor optical device according to claim 3, the manufacturing method further comprising:

after the performing an etching using the plurality of mesa masks, removing regions of the mesa etching stop layer outside of the first mesa structures of the plurality of semiconductor optical devices;

removing partial regions of the first conductivity type semiconductor layer exposed between adjacent semiconductor optical devices out of the plurality of semiconductor optical devices, respectively; so that the first conductivity type layer of the plurality of semiconductor optical device is electrically isolated each other; and forming a first conductivity side electrode and a second conductivity side electrode, the first conductivity side electrode being electrically connected with the first conductivity type semiconductor layer and the second conductivity side electrode being electrically connected with the second conductivity type contact layer.

5. The manufacturing method of the arrayed semiconductor optical device according to claim 3, wherein the first mesa structure is wider than the second mesa structure and the second mesa structure is wider than the third mesa structure for each of the plurality of semiconductor optical devices.

6. The manufacturing method of the arrayed semiconductor optical device according to claim 4, wherein the first mesa structure is wider than the second mesa structure and the second mesa structure is wider than the third mesa structure for each of the plurality of semiconductor optical devices.

* * * * *